United States Patent
Lai et al.

(10) Patent No.: US 6,843,926 B2
(45) Date of Patent: Jan. 18, 2005

(54) IN-SITU MEASUREMENT OF WAFER POSITION ON LOWER ELECTRODE

(75) Inventors: Yu-Chih Lai, Jubei (TW); Cheng-Yi Chang, Taipei (TW); Shih-Shun Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 302 days.

(21) Appl. No.: 10/092,977

(22) Filed: Mar. 7, 2002

(65) Prior Publication Data

US 2003/0168429 A1 Sep. 11, 2003

(51) Int. Cl.[7] .............................. C23F 1/00; H05H 1/00
(52) U.S. Cl. ...................... 216/59; 216/67; 156/345.24
(58) Field of Search ................ 216/59, 67; 156/345.24, 156/345.26, 345.51, 345.52, 345.53; 118/728, 724

(56) References Cited

U.S. PATENT DOCUMENTS

| | | | | |
|---|---|---|---|---|
| 5,344,792 A | * | 9/1994 | Sandhu et al. | 438/660 |
| 6,129,046 A | * | 10/2000 | Mizuno et al. | 118/725 |
| 2003/0026904 A1 | * | 2/2003 | Yadav et al. | 427/294 |

FOREIGN PATENT DOCUMENTS

JP          04219953 A    *   8/1992   ........... H01L/21/68

* cited by examiner

*Primary Examiner*—Parviz Hassanzadeh
(74) *Attorney, Agent, or Firm*—Tung & Associates

(57) ABSTRACT

A method and apparatus for measuring a wafer position on a lower electrode in a plasma etching device are disclosed herein. A wafer is generally placed on a lower electrode in a process chamber of a plasma etching device. Such a wafer (i.e., semiconductor wafer) generally comprises a front side and a back side. A differential pressure gradient between the front side and the back side of the wafer is determined, and thereafter, a position of the wafer on the lower electrode can be measured utilizing the differential pressure gradient.

15 Claims, 1 Drawing Sheet

IN-SITU MEASUREMENT OF WAFER POSITION ON LOWER ELECTRODE

TECHNICAL FIELD

The present invention relates generally to semiconductor fabrication techniques and devices thereof. The present invention also relates to VLSI design techniques and devices thereof. The present invention also relates to plasma etching techniques and devices thereof. The present invention additionally relates to techniques for monitoring a wafer position in a process chamber. The present invention also relates to apparatus for measuring the position of a wafer on a lower electrode in a process chamber.

BACKGROUND OF THE INVENTION

In the manufacture of semiconductor wafers, plasma etching is a process for transferring circuit patterns from the surface of a semiconductor wafer to an underlying layer by using a highly reactive ionized gas to remove unmasked portions of the wafer. As in most manufacturing processes, quality control of a desired product attribute is necessary. In integrated circuit ("IC") manufacturing a key wafer attribute is the post etch thickness of a film on the wafer. Over etching can adversely effect the performance of the final device.

Plasma etching devices for processing wafers are well known. A typical plasma etching apparatus includes a process chamber for processing a substrate by etching. A chuck usually serves as a lower electrode in the process chamber, which can be set in a vacuum state. A lower electrode is typically configured to include an electrostatically attracting electrode for holding the substrate by action of an electrostatic attraction, an insulating plate provided under the electrode, and a lower electrode body provided under the insulating plate. The wafer is generally placed on and fixed to the chuck, and then subjected to the plasma etching process.

There are two commonly utilized techniques for fixing a wafer to a chuck, including mechanical supporting means such as a clamp, and an electrostatic chuck for attaching a wafer by means of an electrostatic attractive force. A typical electrostatic chuck includes a metallic base plate that is coated with a thick layer of slightly conductive dielectric material. A silicon wafer of approximately the same size as the chuck is placed on top of the chuck and a potential difference is applied between the silicon wafer and the base plate of the electrostatic chuck. This causes an electrostatic attraction proportional to the square of the electric field in the gap between the silicon wafer and the chuck face.

When the chuck is used in a plasma filled chamber, the electric potential of the wafer tends to be fixed by the effective potential of the plasma. The purpose of the dielectric layer on the chuck is to prevent the silicon wafer from coming into direct electrical contact with the metallic part of the chuck and shorting out the potential difference. On the other hand, a small amount of conductivity appears to be desirable in the dielectric coating so that much of its free surface between points of contact with the silicon wafer is maintained near the potential of the metallic base plate; otherwise, a much larger potential difference would be needed to produce a sufficiently large electric field in the vacuum gap between the wafer and chuck.

During plasma etching of pattern wafers, the plasma raises the temperature of the wafer to an undesirable level that could damage the wafer. Accordingly, the chuck must be kept as cool as possible. The current preferred method of cooling a plasma chuck is with conductive cooling of the backside of the chuck through the use of helium. The face of the chuck generally includes a pattern of grooves in which helium gas is maintained. This gas provides cooling by thermal contact between the wafer and the chuck. To contain the helium at the chuck and prevent it from escaping into the reaction, a clamp must be incorporated with the chuck to hold the wafer down.

Based on the foregoing it can thus be appreciated that in a process for manufacturing a semiconductor device, plasma can be generated in a process chamber, and a target object such as a semiconductor wafer can be subjected in the atmosphere of the plasma to various types of plasma processes including an etching process. The typical plasma etching apparatus for etching a semiconductor wafer generally includes a process chamber containing a lower electrode for placing the wafer thereon and an upper electrode opposed to the lower electrode.

At the time of performing the etching process, a process gas can be introduced into the process chamber, which is exhausted beforehand and has its inside set to a reduced-pressure atmosphere. Thereafter, an RF power can be applied to at least one of the lower and upper electrodes. As a result, the process gas is converted into plasma. Using this plasma, the target object or wafer may be appropriately etched.

In modern VLSI design and fabrication, the position of a semiconductor wafer on a lower electrode is thus of paramount importance, particular in plasma etching operations. The position of such a wafer on a lower electrode is a factor that significantly influences etching rate and particle development. A wafer shift on a lower electrode can result in over/under etching. Additionally, such a wafer shift can cause the plasma to directly damage the lower electrode and cause particle containment.

Two major systems and/or techniques are currently utilized to clamp the wafer for heat exchange with helium flow between a wafer back-side and a lower electrode. One method and/or system involves the utilization of a clamp device. The other method and/or system is an ESC-based system, well known in the plasma etching arts. In addition to being utilized as a medium back side helium (B/H) flow has been utilized as an index for monitoring the position of a wafer on a lower electrode. Some processes do not require cooling to maintain the wafer temperature. Additionally, detectors or sensors currently do not exist which can pre-warn regarding wafer shifts on a lower electrode.

Based on the foregoing, the present inventors have concluded that a need exists for a method and apparatus which would permit in-situ measurement of the position of a semiconductor wafer on a lower electrode utilized in a process chamber for plasma etching operations. The present inventors thus believe that the method and apparatus disclosed herein solves this important need.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and apparatus.

It is therefore another aspect of the present invention to provide an improved plasma etching method and apparatus.

It is yet another aspect of the present invention to provide a method and apparatus for monitoring the position of a wafer in a process chamber.

It is still another aspect of the present invention to provide a method and apparatus for monitoring the position of a wafer on a lower electrode within a process chamber.

It is yet another aspect of the present invention to provide an in-situ method and apparatus for monitoring the position of a wafer on a lower electrode within a process chamber utilized in plasma etching operations.

The above and other aspects of the present invention can thus be achieved as is now described. A method and apparatus for measuring a wafer position on a lower electrode in a plasma etching device are disclosed herein. A wafer is generally placed on a lower electrode in a process chamber of a plasma etching device. Such process chambers can be utilized in plasma etching operations. A wafer (i.e., semiconductor wafer) generally comprises a front side and a back side. A differential pressure gradient between the front side and the back side of the wafer is determined, and thereafter, a position of the wafer on the lower electrode can be measured utilizing the differential pressure gradient. The process is chamber is generally connected to a pump.

A throttle valve is generally connected to the process chamber. At least one additional valve can be connected to the throttle valve, such that the throttle valve and the additional valve are connected in series with each other between the process chamber and the pump. At least one line (i.e., gas and/or liquid delivery line) is connected to the pump and the process chamber. At least one pressure gauge may be connected to the line between the pump and process chamber. A pressure monitor can be connected to the process chamber to monitor the pressure associated with the process chamber.

The differential pressure gradient between the front side and the back side of the wafer can be determined utilizing a plurality of associated pressure gauges. Helium, in particular, can be delivered to the process chamber and thereafter the differential pressure gradient between the front side and the back side of the wafer can be determined utilizing one or more of the associated pressure gauges. An indication of an unacceptable wafer shift associated with the on the lower electrode can be determined, if the differential pressure gradient is greater than a ten percent value. If the wafer unit is not positioned correctly, holes may be exposed. The foregoing measurement method and apparatus thus can prevent improper positioning of the wafer on the electrode to avoid exposure of such wafer holes. The process chamber generally comprises a plasma etching chamber.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
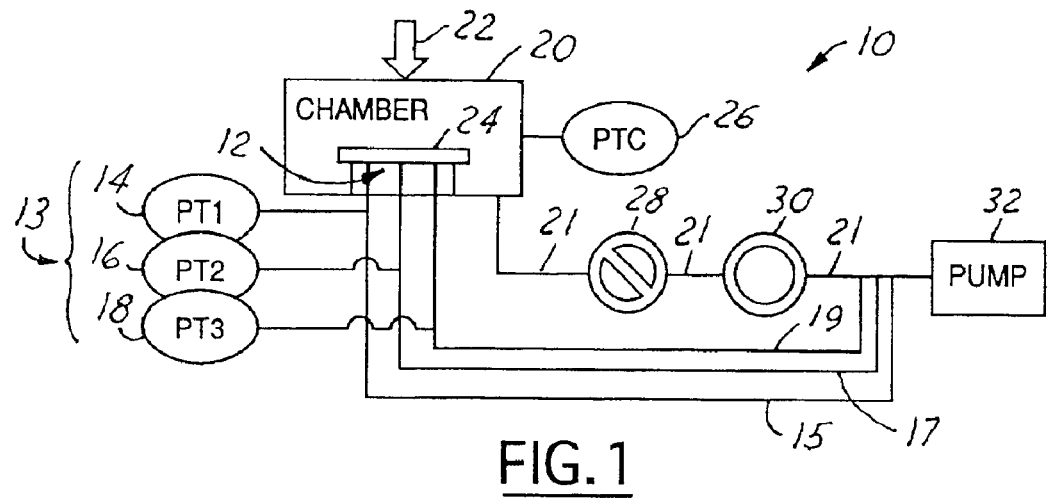
FIG. 1 illustrates a block diagram of a chamber configuration for plasma etching, which may be utilized in accordance with a preferred embodiment of the present invention.

FIG. 1 illustrates a block diagram 10 of a process chamber configuration for plasma etching, which may be utilized in accordance with a preferred embodiment of the present invention. As indicated in FIG. 1, a process chamber 20 is connected to a pump 32 through a plurality of lines 15, 17 and 19. In addition, a line 21 connects process chamber 20 to pump 32. A throttle valve 28 and an ISO valve 30 can also be connected to line 21. ISO valve 30 generally comprises an on/off valve. A throttle valve is generally connected to the process chamber.

Thus, at least one additional valve (i.e., ISO valve 30) can be connected to throttle valve 28 via line 21, such that throttle valve 28 and the additional valve 30 are connected in series with each other between process chamber 20 and pump 32. One or more lines 15, 17, and 19 (i.e., gas and/or liquid delivery line) can be connected to pump 32 and process chamber 20. One or more pressure gauges 14, 16 and 18 may be connected respectively to lines 15, 17 and 19 between pump 32 and process chamber 20.

Pressure gauges 14, 16 and 18 may together form a grouping or plurality pressure gauges 13, which can be utilized to sense the backside 12 pressure of a wafer 24 within process chamber 20. Note that although three pressure gauges 14, 15, and 18 are illustrated in FIG. 1, the particular number of pressure gauges utilized is not considered a limiting feature of the present invention, so long as such pressure gauges are utilized to monitor a wafer backside pressure.

Note that in FIG. 1, pressure gauges 14, 16, and 18 are respectively labeled, PT1, PT2 and PT3. A pressure monitor 26 can be connected to process chamber 20 to monitor the pressure associated with process chamber 20. Pressure monitor 26 is labeled PT C in FIG. 1. In addition, arrow 22 represents the flow of gas into pressure chamber 20. Wafer 24 thus contains a backside which is located on a lower electrode 12.

Chamber pressure associated with process chamber 20 is generally monitored by pressure monitor 26 (PC C) and may be controlled by throttle valve 28 and valve 30. The effective pumping speed S(eff) can be changed by means of different angles of throttle valve 28, wherein $1/S(eff)=L/S(p)+1/C$. $S(p)$ represents the pumping speed associated with pump 32, and C represents the system conductance. The angle of throttle valve 28 can induce varying conductances C, while $S(p)$ is generally constant. Hence, a different effective pumping speed can be obtained as a result of a variable C. Under stable conditions, a relationship between pumping speed S and gas throughput Q can be represented as $Q=P+S$. Note additionally that the variable Q can represent a total gas flow, wherein $Q=C(P1-P2)$, wherein $P1-P2$ generally can represent a pressure differential value.

A variety of conditions can be examined, based on the foregoing. In a first condition, a wafer 24 can be transferred into process chamber 20 placed on the lower electrode 12. Under ideal conditions, $PT1=PT2=PT3=Q/S(p)$ and $PT C=Q/S(eff)=Q*(1/S(p)+1/C)=Q/S(p)+Q/C=PT1+Q/C$, hence PT C may be higher than PT1, PT2, PT3 by $Q/C$. The differential Q/C has a minimal value under Q, which is generally close to 0 wherein C represents a maximum value. PCT is generally close to PT1, PT2, and PT3.

In a second condition, N2 gas can flow into process chamber 20, as indicated by arow 22 with 500 sccm and the chamber pressure PT C=2000 mTorr. Under this condition, throttle valve 28 must change an angle to meet Q=P*S and the difference Q/C between PT C and PT1, PT2, and PT3 will rise due to a higher Q value and a smaller C value.

In a third condition, a wafer 23 can be transferred into process chamber 20 and allowed to shift to the right side. The scenario of the second condition described above can be added to this third condition, such that gas will be pumped through a left line and induce PT1 to rise (i.e., P=Q/S). Hence, the pressure gradient between PT C and PT1 is generally lower than the gradient between PTC and PT2 or PT3.

Figure 2:
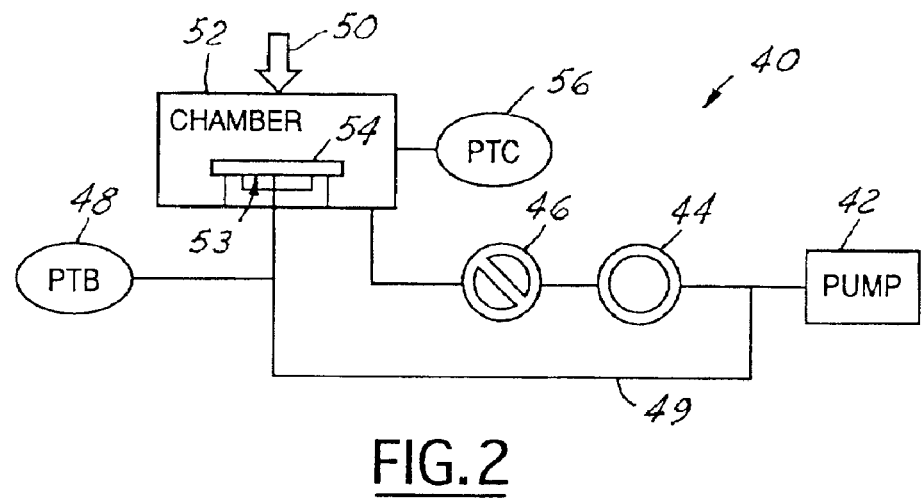
FIG. 2 depicts a block diagram of a chamber configuration for plasma etching under normal wafer transfer conditions, in accordance with a preferred embodiment of the present invention.

FIG. 2 depicts a block diagram 40 of a process chamber configuration for plasma etching under normal wafer transfer conditions, in accordance with a preferred embodiment of the present invention. As indicated in FIG. 2, a semiconductor wafer 54 generally placed on a lower electrode 53 in a process chamber 52 of a plasma etching device. Such process chambers can be utilized in plasma etching operations. Wafer 54 (i.e., semiconductor wafer) generally comprises a front side and a back side. A differential pressure gradient between the front side and the back side of wafer 54 can thus be determined, and thereafter, a position of wafer 54 on lower electrode 53 can be measured utilizing the differential pressure gradient. Process chamber 52 is generally connected to a pump 42. Note that gas flow into process chamber 52 can be generally indicated by arrow 50.

A throttle valve 46 is generally connected to process chamber 52. At least one additional valve 44 can be connected to throttle valve 46, such that throttle valve 46 and the additional valve 44 are connected in series with each other between process chamber 52 and pump 42. At least one line 49 (i.e., gas and/or liquid delivery line) is connected to pump 42 and process chamber 52. At least one pressure gauge 48, which is labeled PT B in FIG. 2, may be connected to line 49 between pump 42 and process chamber 52. A pressure monitor 56, which is labeled PT C in FIG. 2, can be connected to process chamber 52 to monitor the pressure associated with process chamber 52.

Figure 3:
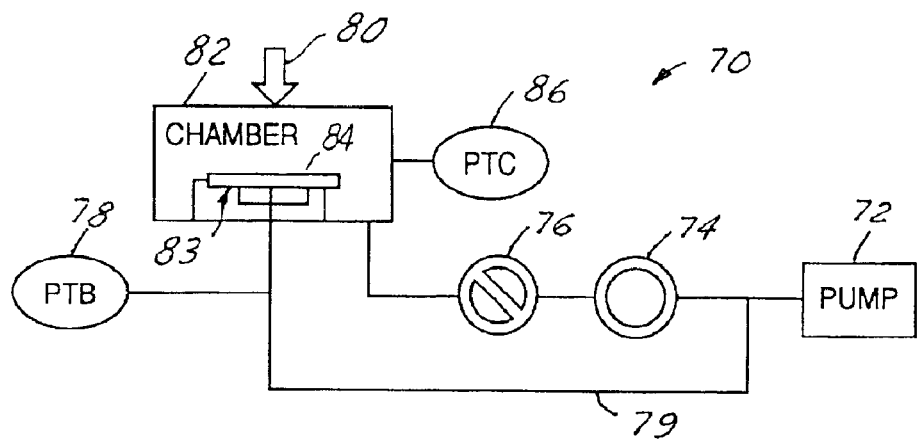
FIG. 3 illustrates a block diagram of a chamber configuration for plasma etching under wafer transfer shift conditions, in accordance with a preferred embodiment of the present invention.

FIG. 3 illustrates a block diagram 70 of a chamber configuration for plasma etching under wafer transfer shift conditions, in accordance with a preferred embodiment of the present invention. As indicated in FIG. 3, a semiconductor wafer 84 generally placed on a lower electrode 83 in a process chamber 82 of a plasma etching device. Such process chambers can be utilized in plasma etching operations. Wafer 84 (i.e., semiconductor wafer) generally comprises a front side and a backside. A differential pressure gradient between the front side and the backside of wafer 84 can thus be determined, and thereafter, a position of wafer 84 on lower electrode 83 can be measured utilizing the differential pressure gradient. Process chamber 82 is generally connected to a pump 72. Gas flow into process chamber 82 is generally represented by arrow 80.

A throttle valve 76 is generally connected to process chamber 82. At least one additional valve 74 can be connected to throttle valve 76, such that throttle valve 76 and the additional valve 74 are generally connected in series with each other between process chamber 82 and pump 72. At least one line 79 (i.e., gas and/or liquid delivery line) is connected to pump 72 and process chamber 82. At least one pressure gauge 78, which is labeled PT B in FIG. 3, may be connected to line 79 between pump 72 and process chamber 82. A pressure monitor 86, which is labeled PT C in FIG. 3, can be connected to process chamber 82 to monitor the pressure associated with process chamber 82.

FIGS. 2 and 3 thus respectively represent normal and shift conditions. Experimental data can be obtained based on a chamber pressure of 2000 Mtorr, with N2 gas 500 Sccm. Utilizing normal and shift conditions, the following experimental data can thus be compiled, as indicated in Table 1:

TABLE 1

| EQ | Transfer | PT C (Mtorr) | PT B (Mtorr) | ∇ P (PT C − PT B) |
|---|---|---|---|---|
| 4420 | Normal | 2000 | 640 | 1360 |
|  | Shift | 2000 | 1040 | 960 |
| 4720 | Normal | 2000 | 400 | 1600 |
|  | Shift | 2000 | 1100 | 900 |

Thus, according to the experimental data indicated in Table 1 above, it can be appreciated that utilizing a differential pressure gradient due to varying pumping speeds and gas throughput at the wafer front and back side can detect whether the wafer is exactly located on a lower electrode.

Based on the foregoing, it can be appreciated that the present invention disclosed herein generally describes a method and apparatus for measuring a wafer position on a lower electrode in a plasma etching device are disclosed herein. A wafer can be placed on a lower electrode in a process chamber of a plasma etching device. Such process chambers can be utilized in plasma etching operations. A wafer (i.e., semiconductor wafer) generally comprises a front side and a back side. A differential pressure gradient between the front side and the back side of the wafer is determined, and thereafter, a position of the wafer on the lower electrode can be measured utilizing the differential pressure gradient. The process is chamber is generally connected to a pump.

A throttle valve is generally connected to the process chamber. At least one additional valve can be connected to the throttle valve, such that the throttle valve and the additional valve are connected in series with each other between the process chamber and the pump. At least one line (i.e., gas and/or liquid delivery line) can be connected to the pump and the process chamber. At least one pressure gauge may be connected to the line between the pump and process chamber. A pressure monitor can be connected to the process chamber to monitor the pressure associated with the process chamber.

The differential pressure gradient between the front side and the back side of the wafer can be determined utilizing a plurality of associated pressure gauges. Helium, in particular, can be delivered to the process chamber and thereafter the differential pressure gradient between the front side and the back side of the wafer can be determined utilizing one or more of the associated pressure gauges. An indication of an unacceptable wafer shift associated with the on the lower electrode can be determined, if the differential pressure gradient is greater than a ten percent value. If the wafer unit is not positioned correctly, holes may be exposed. The foregoing measurement method and apparatus thus can prevent improper positioning of the wafer on the electrode to avoid exposure of such wafer holes. The process chamber generally comprises a plasma etching chamber.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for measuring a wafer position on a lower electrode in a plasma etching device, said method comprising the step of:

placing a wafer on a lower electrode in a process chamber of a plasma etching device, wherein said wafer comprises a front side and a back side;

determining a differential pressure gradient between said front side and said back side of said wafer on said lower electrode within said process chamber; and measuring a position of said wafer on said lower electrode utilizing said differential pressure gradient while said wafer is located on said lower electrode in order to detect a wafer shift thereof on said lower electrode.

2. The method of claim 1 further comprising the step of: connecting said process chamber to a pump.

3. The method of claim 2 further comprising the steps of:

connecting at least one line between said pump and said process chamber; and connecting at least one pressure gauge to said at least one line between said pump and said process chamber in order to support said determining said pressure gradient between said front side and back side of said wafer and said measuring said position of said wafer on said lower electrode utilizing said differential pressure gradient while said wafer is located on said lower electrode in order to detect said wafer shift on said lower, electrode.

4. The method of claim 1 further comprising the step of: connecting a throttle valve to said process chamber.

5. The method of claim 4 further comprising the step of:

connecting at least one additional valve to said throttle valve, wherein said throttle valve and said at least one additional valve are connected in series with one another between said process chamber and said pump in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode.

6. The method or claim 1 further comprising the step of:

connecting a pressure monitor to said process chamber to monitor a pressure associated with said process chamber in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode.

7. The method of claim 1 wherein the step of determining a differential pressure gradient between said front side and said back side of said wafer, further comprises the step of: determining said differential pressure gradient between said front side and said back side of said wafer utilizing a plurality of associated pressure gauges.

8. The method of claim 1 further comprising the steps of:

delivering helium to said process chamber; and thereafter determining said differential pressure gradient between said front said and said back side of said wafer utilizing a plurality of associated pressure gauges.

9. The method of claim 1 further comprising the step of: indicating an unacceptable wafer shift associated with said on said lower electrode, if said differential pressure gradient is greater than a ten percent value.

10. The method of claim 1 wherein said process chamber comprises a plasma etching chamber.

11. A method for measuring a wafer position on a lower electrode in a plasma etching device, said method comprising the steps of:

connecting a process chamber of a plasma etching device to a pump;

attaching a throttle valve to said process chamber;

connecting a pressure monitor to said process chamber to monitor a pressure associated with said process chamber;

placing a wafer on a lower electrode in said process chamber of said plasma etching device, wherein said wafer comprises a front side and a back side;

determining said differential pressure gradient between said front side and said back side of said wafer utilizing a plurality of associated pressure gauges; and measuring a position of said wafer on said lower electrode utilizing said differential pressure gradient, in response to determining said differential pressure gradient between said front side and said back side of said wafer utilizing a plurality of associated pressure gauges.

12. The method of claim 11 further comprising the step of:

connecting at least one pressure gauge to said at least one line between said pump and said process chamber in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode.

13. The method of claim 11 further comprising the steps of:

delivering helium to said process chamber; and thereafter determining said differential pressure gradient between said front said and said back side of said wafer utilizing a plurality of associated pressure gauges in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode.

14. The method of claim 11 further comprising the step of: indicating an unacceptable wafer shift associated with said on said lower electrode, if said differential pressure gradient is greater than a ten percent value.

15. The method of claim 11 further comprising the steps of:
connecting at least one pressure gauge to said at least one line between said pump and said process chamber in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode;
delivering helium to said process chamber;

thereafter determining said differential pressure gradient between said front said and said back side of said wafer utilizing a plurality of associated pressure gauges in order to support said determining said pressure gradient between said front side and back side of said wafer and said measuring said position of said wafer on said lower electrode utilizing said differential pressure gradient while said wafer is located on said lower electrode in order to detect said wafer shift on said lower electrode; and
indicating an unacceptable wafer shift associated with said on said lower electrode, if said differential pressure gradient is greater than a ten percent value.

* * * * *